(12) United States Patent
Kim et al.

(10) Patent No.: US 10,727,440 B2
(45) Date of Patent: Jul. 28, 2020

(54) DISPLAY DEVICE AND MANUFACTURING METHOD THEREOF

(71) Applicant: SAMSUNG DISPLAY CO., LTD., Yongin-si, Gyeonggi-do (KR)

(72) Inventors: Byoung Yong Kim, Seoul (KR); Jeong Ho Hwang, Cheonan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 26 days.

(21) Appl. No.: 15/658,597

(22) Filed: Jul. 25, 2017

(65) Prior Publication Data

US 2018/0034002 A1 Feb. 1, 2018

(30) Foreign Application Priority Data

Jul. 28, 2016 (KR) .......................... 10-2016-0096281

(51) Int. Cl.
| | |
|---|---|
| *H01L 27/32* | (2006.01) |
| *H01L 51/52* | (2006.01) |
| *H01L 51/00* | (2006.01) |
| *H01L 51/56* | (2006.01) |

(52) U.S. Cl.
CPC ...... *H01L 51/5253* (2013.01); *H01L 51/0097* (2013.01); *H01L 51/56* (2013.01); *H01L 27/3244* (2013.01); *H01L 51/5281* (2013.01); *H01L 2251/5338* (2013.01)

(58) Field of Classification Search
CPC .................................................. H01L 51/5281
See application file for complete search history.

(56) References Cited

U.S. PATENT DOCUMENTS

| | | | |
|---|---|---|---|
| 2014/0042406 A1 | 2/2014 | Degner et al. | |
| 2014/0240985 A1* | 8/2014 | Kim ....................... | H05K 1/028 362/249.04 |
| 2015/0146386 A1* | 5/2015 | Namkung .............. | H05K 1/028 361/749 |
| 2015/0380524 A1* | 12/2015 | Ishihara ............ | H01L 21/02656 257/66 |

(Continued)

FOREIGN PATENT DOCUMENTS

| | | |
|---|---|---|
| KR | 10-2014-0085956 A | 7/2014 |
| KR | 10-2015-0007632 A | 1/2015 |
| KR | 10-2015-0062237 A | 6/2015 |

*Primary Examiner* — Julio J Maldonado
*Assistant Examiner* — Omar F Mojaddedi
(74) *Attorney, Agent, or Firm* — Kile Park Reed & Houtteman PLLC

(57) ABSTRACT

A display device includes a substrate including a display area and a peripheral area outside the display area, the peripheral area including a bendable bending region, a display member on the display area of the substrate to display an image, and a protection film under the substrate, the protection film including a groove at a position corresponding to the bending region of the peripheral area, wherein the groove includes a bottom surface and inner walls extending from the bottom surface to a surface of the protection film, a boundary part being defined at an intersection of each inner wall with the surface of the protection film, and wherein boundary parts adjacent to opposite ends of the protection film are separated from the opposite ends of the protection film, respectively.

17 Claims, 11 Drawing Sheets

(56) References Cited

U.S. PATENT DOCUMENTS

| | | | |
|---|---|---|---|
| 2016/0093683 A1* | 3/2016 | Lee | H01L 51/0097 257/40 |
| 2016/0143130 A1 | 5/2016 | Wu et al. | |
| 2016/0204183 A1* | 7/2016 | Tao | H01L 51/0097 257/40 |
| 2017/0092884 A1* | 3/2017 | Zhang | H01L 51/0097 |

* cited by examiner

DISPLAY DEVICE AND MANUFACTURING METHOD THEREOF

CROSS-REFERENCE TO RELATED APPLICATION

Korean Patent Application No. 10-2016-0096281, filed on Jul. 28, 2016, in the Korean Intellectual Property Office, and entitled: "Display Device and Manufacturing Method Thereof," is incorporated by reference herein in its entirety.

BACKGROUND

1. Field

The present disclosure relates to a display device and a manufacturing method thereof.

2. Description of the Related Art

In general, a display device, e.g., a liquid crystal display (LCD), an organic light emitting diode (OLED) display device, and the like, may include a display unit displaying an image and a bezel part enclosing a periphery thereof. A driving circuit chip, wires, and the like to drive a display member positioned at the display unit may be positioned in the bezel part.

SUMMARY

A display device according to an exemplary embodiment includes a substrate including a display area and a peripheral area outside the display area; a display member positioned at the display area of the substrate and displaying an image; and a protection film adhered under the substrate, wherein the peripheral area includes a bending region that is bent, the protection film has one groove at a position corresponding to the bending region, the one groove includes a bottom surface and inner walls extending from the bottom surface to a surface of the protection film, and a boundary part between the inner walls adjacent to both ends of the protection film among the inner walls and the surface of the protection film is positioned to be separated from both ends of the protection film.

At least one among the inner walls may be inclined.

An area of an entrance of the groove positioned on the same plane as a surface of the protection film may be larger than an area of a bottom surface of the groove.

The groove may have a rectangular shape on a plane and a trapezoidal shape on a cross-section.

The inner walls may include a first long wall and a second long wall facing each other and a first short wall and a second short wall connecting the first long wall and the second long wall to each other, and the first short wall and the second short wall may be inclined.

A first separation distance from one end of the protection film to the first short wall of the groove may be about 1% to about 10% of an entire width of the protection film, and a second separation distance from the other end of the protection film to the second short wall of the groove may be about 1% to about 10% of the entire width of the protection film.

A first inclination angle formed by the bottom surface of the groove and the first short wall may be in a range of 30 degrees to 60 degrees, and a second inclination angle formed by the bottom surface of the groove and the second short wall may be in a range of 30 degrees to 60 degrees.

The bottom surface of the groove may have a plurality of protrusions, and a height of the protrusions may be about 200 nm or more.

The first long wall and the second long wall may be inclined.

A third inclination angle formed by the bottom surface of the groove and the first long wall may be in a range of 30 degrees to 60 degrees, and a fourth inclination angle formed by the bottom surface of the groove and the second long wall may be in a range of about 30 degrees to about 60 degrees.

The groove may be positioned to be separated from one end of the protection film, and the bottom surface of the groove is connected to the other end of the protection film.

The inner wall may include a first long wall and a second long wall facing each other and a first short wall connecting the first long wall and the second long wall to each other, and the first short wall may be inclined.

The first separation distance from one end of the protection film to the first short wall of the groove may be in a range of about 1% to about 10% of the entire width of the protection film.

A first inclination angle formed by the bottom surface of the groove and the first short wall may be in a range of about 30 degrees to about 60 degrees.

The bottom surface of the groove may have a plurality of protrusions, and the height of the protrusions may be about 200 nm or more.

A display device according to another exemplary embodiment includes: a substrate including a display area and a peripheral area outside the display area; a display member positioned at the display area of the substrate and displaying an image; and a protection film adhered under the substrate, wherein the peripheral area includes a bending region that is bent, the protection film has a groove at a position corresponding to the bending region, the groove includes a bottom surface and inner walls extending from the bottom surface to a surface of the protection film, a boundary part between the inner walls adjacent to both ends of the protection film among the inner walls and the surface of the protection film is positioned to be separated from both ends of the protection film, and the inner walls are inclined from the bottom surface.

A method for manufacturing a display device according to an exemplary embodiment includes: adhering a protection film under a substrate; and forming one groove at a position corresponding to a bending region of the substrate among the protection film by a bit processing method, wherein an inner wall of the groove is positioned to be separated from both ends of the protection film.

The bit processing method may include: forming an inclined first short wall on the protection film by using a bit; forming a bottom surface connected to the first short wall; and forming an inclined second short wall connected to the bottom surface to complete the groove.

The step of forming the first short wall may include cutting the protection film while lowering the bit to be inclined, the step of forming the bottom surface may include cutting the protection film while horizontally moving the bit, and the step of forming the second short wall may include cutting the protection film while increasing the bit to be inclined.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
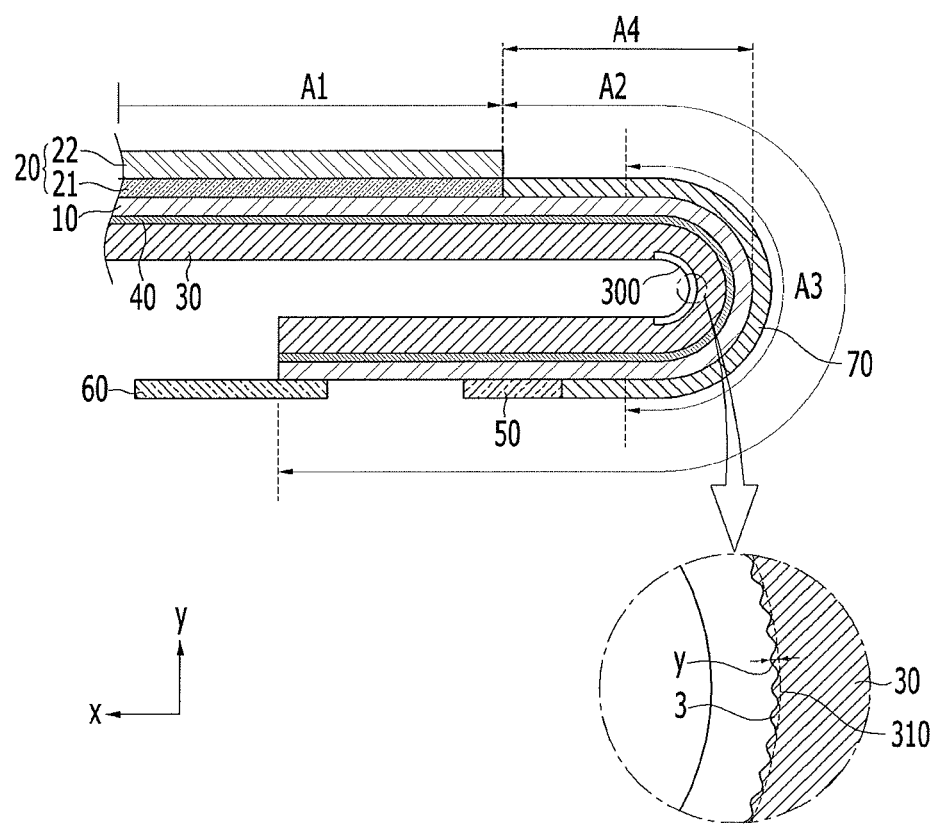
FIG. 1 illustrates a schematic lateral view of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

In addition, unless explicitly described to the contrary, the word "comprise" and variations such as "comprises" or "comprising" will be understood to imply the inclusion of stated elements but not the exclusion of any other elements. Further, "~on" means positioned on or below a portion of a target or positioned on the upper side without being based on a gravity direction, throughout the specification.

Figure 2:
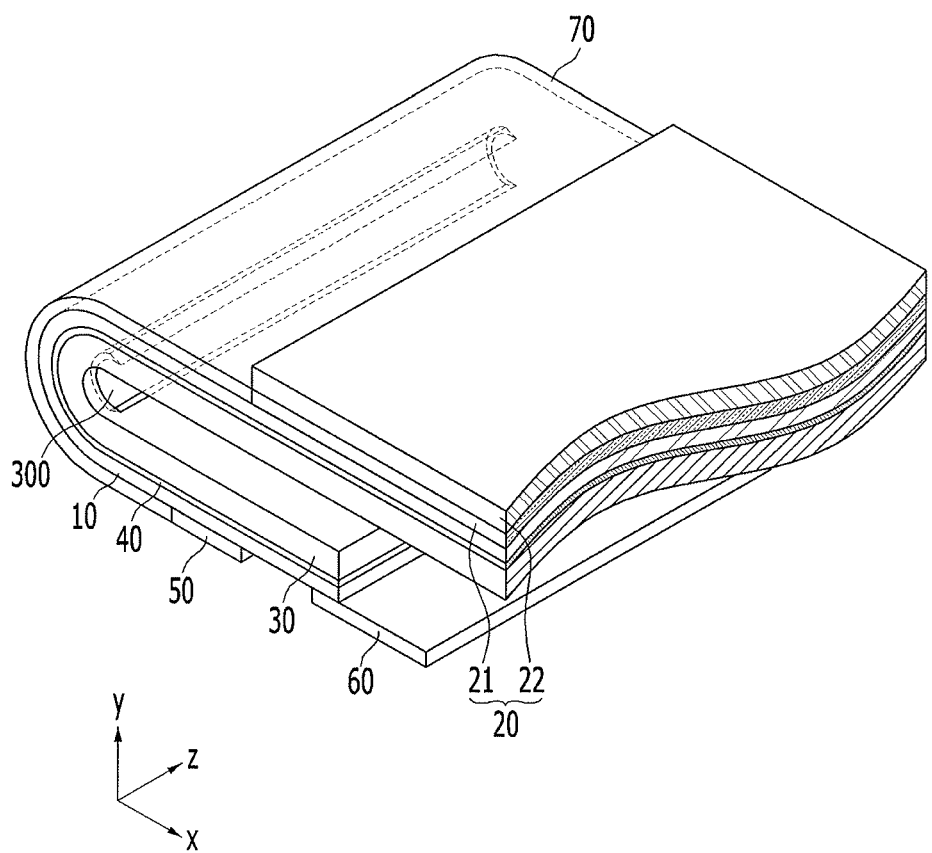
FIG. 2 illustrates a schematic perspective view of a display device of FIG. 1.

FIG. 1 is a schematic lateral view of a display device according to an exemplary embodiment, and FIG. 2 is a schematic perspective view of a display device of FIG. 1.

As shown in FIGS. 1 and 2, a display device according to an exemplary embodiment may include a substrate 10, a display member 20 positioned on the substrate 10 and displaying an image, and a protection film 30 adhered under the substrate 10. An adhesive 40 is interposed between the substrate 10 and the protection film 30 to adhere the substrate 10 and the protection film 30 to each other.

The substrate 10 includes a display area A1, i.e., in which the display member 20 is positioned, and a peripheral area A2, i.e., an area outside of the display area A1. The peripheral area A2 includes a bending region A3, i.e., where the substrate 10 is bent. The bending region A3 refers to a region where a curvature is larger than zero (0), i.e., the bending region A3 includes a region of the substrate 10 where a curvature is larger than zero (0). For example, the bending region A3 of the present exemplary embodiment may include a region from one position where the curvature starts to be larger than zero (0) to another position just before the curvature becomes zero (0) after the curvature is gradually increased and then decreased. For example, as illustrated in FIG. 1, the peripheral area A2 may extend away from the display area A1 to be bent toward the protection film 30 on a rear surface of the substrate 10, with a portion of the peripheral area A2 including the bending region A3, i.e., a portion of the peripheral area A2 that bends and curves.

As will be described in more detail below, by bending the peripheral area A2 of the substrate 10, i.e., to define the bending region A3, a width of a bezel part A4 may be minimized. When viewing the display device from the front, the bezel part A4 refers to an outer part of the display member 20, e.g., the bezel part A4 may define a portion of the display device on the substrate 10 that is outside, e.g., external to, the display member 20.

The substrate 10 may include a flexible material for the bending. For example, the substrate 10 may be a film type including one of a polyester-based polymer, a silicon-based polymer, an acryl-based polymer, a polyolefin-based polymer, and a copolymer thereof. In detail, the substrate 10 may include one of, e.g., polyethylene terephthalate (PET), polybutylene terephthalate (PBT), polysilane, polysiloxane, polysilazane, polycarbosilane, polyacrylate, polymethacrylate, poly(methyl acrylate), poly(ethyl acrylate), poly(ethyl methacrylate), a cyclic olefin copolymer (COC), a cyclic olefin polymer (COP), polyethylene (PE), polypropylene (PP), polyimide (PI), poly(methyl methacrylate) (PMMA), polystyrene (PS), polyacetal (POM), polyetheretherketone (PEEK), polyethersulfone (PES), polytetrafluoroethylene (PTFE), polyvinylchloride (PVC), polycarbonate (PC), polyvinylidene fluoride (PVDF), a perfluoroalkyl polymer (PFA), a styrene acrylonitrile copolymer (SAN), and combinations thereof.

The display member 20 may be a flat display panel, e.g., an organic light emitting panel, a liquid crystal panel, and the like. The display member 20 may include an emission layer, a light emission member 21 including a switching layer switching the emission layer, and a reflection preventing layer 22 positioned on the light emission member 21 and preventing reflection of external light to improve display quality.

The reflection preventing layer 22 may include a plurality of thin film layers. The plurality of thin film layers may include at least one metal thin film and at least one dielectric layer that are alternately deposited. Further, the reflection preventing layer 22 may include a touch sensor used as an input device of the display member.

In the present exemplary embodiment, the reflection preventing layer 22 is patterned with the same shape as the light emission member, e.g., to be positioned only in the display area A1. However, embodiments are not limited thereto, e.g., the reflection preventing layer 22 may extend to the bending region A3 to have a function of a bending protection layer.

In addition, in the present exemplary embodiment, the reflection preventing layer 22 is positioned inside the display member 20. However, embodiments are not limited thereto, e.g., the reflection preventing layer 22 may be adhered outside the display member 20 as a separate polarization film.

The protection film 30 may be on the rear surface of the substrate 10, i.e., the substrate 10 may be between the display member 20 and the protection film 30. The protection film 30 has a groove 300 at a position corresponding to the bending region A3 of the substrate 10, e.g., the groove 300 may extend in the bending region A3 of the substrate 10 along a surface of the protection film facing away from the substrate 10. The groove 300 minimizes stress acting on the substrate 10 and the protection film 30 during the bending, thereby preventing damage to the substrate 10 in the bending region A3 during the bending.

A driving circuit chip 50 generating a driving signal for driving the display member 20 is positioned in the peripheral area A2 of the substrate 10. Also, a printed circuit board (PCB) 60 generating an external signal to be transmitted to the driving circuit chip 50 or the display member 20 is adhered at one end of the substrate 10.

A bending protection layer 70 is positioned on the peripheral area A2 of the substrate 10. In the present exemplary embodiment, the bending protection layer 70 is positioned, e.g., continuously extends, from an end of the display member 20 to an end of the driving circuit chip 50 through the bending region A3.

The bending protection layer 70 may control a position of a neutral plane (NP) at which a strain is substantially zero when bending for a strain stress applied to the substrate 10 to be a compressive stress rather than a tensile stress. Accordingly, the damage to the bending region A3 of the substrate 10 is minimized.

An elastic coefficient (elastic modulus) of the bending protection layer 70 may be in a range of about 500 MPa to about 100 GPa. However, embodiments are not limited thereto, e.g., the elastic coefficient of the bending protection layer 70 may be changed depending on a design condition such as a thickness of the substrate 10 and the like.

The bending protection layer 70 may include a resin based on an acryl or silicon, and fine particles may be included in the resin. The fine particles may include rubber including a silica, an epoxy, a polymer-based nanoparticle, e.g., an epoxy hybrid, or a microparticle. Also, the bending protection layer 70 may include various film series including polyethylene terephthalate (PET), the like.

Figure 3:
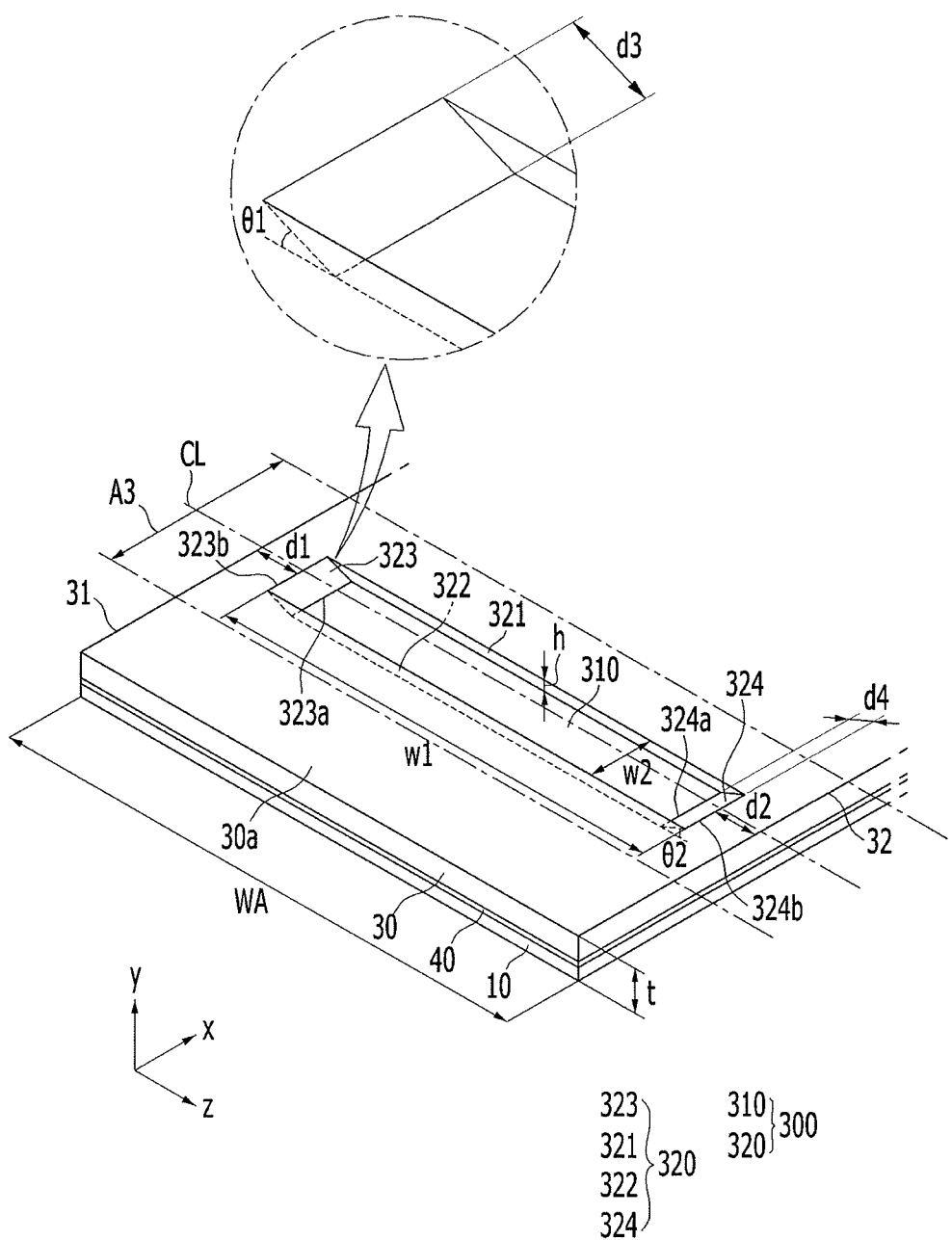
FIG. 3 illustrates a view of a flipped state of a substrate and a protection film before bending the substrate and the protection film of FIG. 1.

Next, a detailed structure of the protection film 30 will be described with reference to FIG. 3. FIG. 3 is a view of a flipped state of the substrate 10 and the protection film 30 before bending the substrate 10 and the protection film 30 of FIG. 1.

As shown in FIG. 3, the groove 300 is positioned to be separated from first and second ends 31 and 32 of the protection film 30. That is, the groove 300 is separated, e.g., spaced apart, from each of the first and second ends 31 and 32 of the protection film 30 by a predetermined interval.

The groove 300 includes a bottom surface 310 and an inner wall 320 extending from the bottom surface 310 to a surface 30a of the protection film 30. The inner wall 320 of the groove 300 includes a first long wall 321 and a second long wall 322 facing each other, and a first short wall 323 and a second short wall 324 connecting the first long wall 321 and the second long wall 322 to each other. The first long wall 321 and the second long wall 322 may have the same length w1, and the first short wall 323 and the second short wall 324 may have the same length w2. If the first long wall 321 and the second long wall 322 do not have the same length w1, a difference is generated in the strain force affecting the first long wall 321 and the second long wall 322 when bending such that the protection film 30 and the substrate 10 may be twisted when bending. Also, if the first short wall 323 and the second short wall 324 do not have the same length w2, a difference is generated in the strain force affecting the first short wall 323 and the second short wall 324 when bending such that the protection film 30 and the substrate 10 may be twisted when bending.

Each length w1 of the first long wall 321 and the second long wall 322 may be larger than each length w2 of the first short wall 323 and the second short wall 324. As each length w1 of the first long wall 321 and the second long wall 322 parallel to a bending line CL is larger than each length w2 of the first short wall 323 and the second short wall 324 that are perpendicular to the bending line CL, the strain force is minimized when bending. That is, an amount of the protection film 30 positioned at the bending region A3 to receive the strain force is decreased such that the strain force is minimized, thereby facilitating the bending. In other words, a length of the groove 300 along the bending line CL is larger than a width of the groove 300, thereby minimizing the mount of material of the protection film 30 along the bending line CL in the bending region A3, which in turn, reduced the strain force generated during bending of the bending region A3.

Accordingly, the groove 300 may have a rectangular shape on a plane. Here, "on a plane" means to view the protection film 30 from the top.

A lower part 323a of the first short wall 323 is a boundary part that meets the bottom surface 310, and an upper part 323b of the first short wall 323 is a boundary part that meets the surface 30a of the protection film 30. A lower part 324a of the second short wall 324 is a boundary part that meets the bottom surface 310, and an upper part 324b of the second short wall 324 is a boundary part that meets the surface 30a of the protection film 30.

An area of an entrance of the groove 300 positioned on the same plane as the surface 30a of the protection film 30 may be larger than an area of the bottom surface 310 of the groove. For example, as illustrated in FIG. 3, each of the first and second short walls 323 and 324 may be inclined at an obtuse angle with respect to the bottom surface 310, so an area of a topmost opening of the groove 300 level with the surface 30a of the protection film 30 may be larger than the area of the bottom surface 310.

The upper part 323b of the first short wall 323 of the groove 300 is separated from the first end 31 of the protection film 30, and the upper part 324b of the second short wall 324 of the groove 300 is separated from the second end 32 of the protection film 30. A first separation distance d1, e.g., along the z-axis, from the first end 31 of the protection film 30 to the upper part 323b of the first short wall 323 of the groove 300 may be in the range of about 1% to about 10% of an entire width WA of the protection film 30. A second separation distance d2 from the second end 32 of the protection film 30 to the upper part 324b of the second short wall 324 of the groove 300 is in the range of about 1% to about 10% of the entire width WA, e.g., in the x-axis, of the protection film 30.

When the first separation distance d1 or the second separation distance d2 is smaller than about 1% of the entire width WA of the protection film 30, the substrate 10 and the protection film 30 are easily damaged when handling the substrate 10 and the protection film 30. When the first separation distance d1 or the second separation distance d2 is larger than about 10% of the entire width WA of the protection film 30, a volume of the groove 300 formed in the protection film 30 is reduced such that the amount of the protection film 30 positioned at the bending region A3 increases, thereby increasing bending stress during bending.

In other words, since a reduced volume of the groove 300 increases the amount of material of the protection film 30 that must be bent in the bending region A3, the bending stress increases when bending the substrate 10 and the protection film 30.

The first short wall 323 and the second short wall 324 are inclined based on the bottom surface 310. Accordingly, the groove 300 may have a trapezoidal shape as viewed in a cross-section. Here, "a cross-section" refers to a view in a cross-section of the protection film 30 that is vertically cut at a side, e.g., as viewed from a side when the protection film 30 is cut along bending line CL.

A first inclination angle θ1 formed by the bottom surface 310 and the first short wall 323 of the groove 300 may be in a range of about 30 degrees to about 60 degrees. A second inclination angle θ2 formed by the bottom surface 310 and the second short wall 324 of the groove 300 may be in a range of about 30 degrees to about 60 degrees.

When the first inclination angle θ1 or the second inclination angle θ2 is smaller than about 30 degrees, the volume of the groove 300 decreases such that the amount of the protection film 30 positioned at the bending region A3 increases. Accordingly, since the amount of the protection film 30 to be bent in the bending region A3 increases, the bending stress increases when bending the substrate 10 and the protection film 30. When the first inclination angle θ1 or the second inclination angle θ2 is larger than about 60 degrees, the protection film 30 is easily damaged by the force applied to the protection film 30 by a bit 1 (referring to FIG. 5).

The first short wall length d3 as the distance from the lower part 323a of the first short wall 323 to the upper part 323b may be in the range of about 1% to about 10% of the entire width WA of the protection film 30. The second short wall length d4 as the distance from the lower part 324a of the second short wall 324 to the upper part 324b may be in the range of about 1% to about 10% of the entire width WA of the protection film 30.

Figure 5:
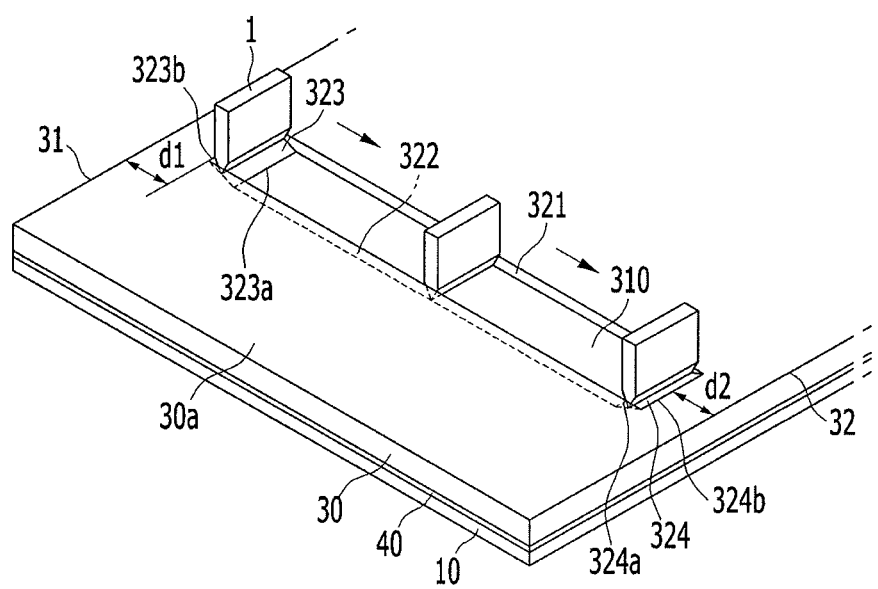
FIG. 5 illustrates a view showing a step following that of FIG. 4.

When the first short wall length d3 or the second short wall length d4 is smaller than about 1% of the entire width WA of the protection film 30, the protection film 30 is easily damaged by the force applied to the protection film 30 by the bit 1 (referring to FIG. 5). When the first short wall length d3 or the second short wall length d4 is larger than about 10% of the entire width WA of the protection film 30, the volume of the groove 300 formed on the protection film 30 decreases such that the amount of the protection film 30 positioned in the bending region A3 increases. Accordingly, since the amount of the protection film 30 to be bent in the bending region A3 increases, the bending stress increases when bending the substrate 10 and the protection film 30.

A depth h, e.g., along the y-axis, of the groove 300 may be in the range of about 50% to about 90% of a thickness t, e.g., along the y-axis, of the protection film 30, when the protection film 30 is in an unbent state (FIG. 3). When the depth h of the groove 300 is smaller than 50% of the thickness t of the protection film 30, the volume of the groove 300 decreases such that the amount of the protection film 30 positioned in the bending region A3 increases. Accordingly, since the amount of the protection film 30 to be bent in the bending region A3 increases, the bending stress increases when bending the substrate 10 and the protection film 30. When the depth h of the groove 300 is larger than about 90% of the thickness t of the protection film 30, the substrate 10 and the protection film 30 are easily damaged when handling the substrate 10 and the protection film 30.

Meanwhile, because the groove 300 is formed by a bit processing method using the bit 1, roughness of the bottom surface 310 of the groove and the inner wall 320 is increased. For example, as shown in FIG. 1, the bottom surface 310 of the groove 300 has a plurality of protrusions 3, and a height y of the protrusion 3 may be about 200 nm or more. If the groove 300 were to be formed by using a laser, a height of resultant protrusions included on the bottom surface 310 of the groove 300 could be about 20 nm, i.e., about ¹⁄₁₀ of the height y of the protrusion 3 included in the bottom surface 310 of the groove 300 according to the present exemplary embodiment.

A manufacturing method of the display device according to an exemplary embodiment will be described with reference to FIGS. 4-7. FIGS. 4-7 illustrate stages in the method of manufacturing the display device of FIG. 1.

Figure 4:
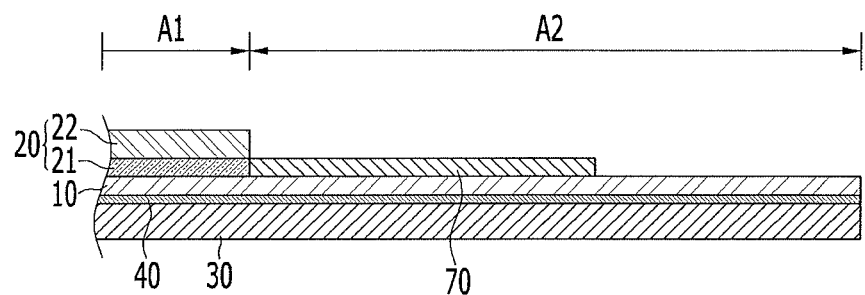
FIG. 4 illustrates a view showing one step of a manufacturing method of a display device of FIG. 1.

First, as shown in FIG. 4, the display member 20 is formed in the display area A1 of the substrate 10. The adhesive 40 is formed under the substrate 10, and the protection film 30 is adhered under the adhesive 40. The bending protection layer 70 is formed in a part of the peripheral area A2 of the substrate 10.

Next, as shown in FIG. 5, the substrate 10 and the protection film 30 are flipped, e.g., turned upside-down to have the protection film 30 face upward. The groove 300 is, then, formed in the protection film 30 at a position corresponding to the bending region A3 of the substrate 10 among the protection film 30. The groove 300 is formed by the bit processing method using the bit 1.

The bit 1 is positioned at the surface of the protection film 30 at the position where the groove 300 is to be formed. In this case, the bit 1 is positioned to be separated from the first end 31 of the protection film 30. Also, by cutting the protection film 30 while moving the bit 1 downward to be inclined from the surface of the protection film 30, the inclined first short wall 323 is formed. Accordingly, the upper part 323b of the first short wall 323 is positioned to be separated from one end 31 of the protection film 30 by the first separation distance d1.

Further, by cutting the protection film 30 while horizontally moving the bit 1, the bottom surface 310 of the groove 300, the first long wall 321, and the second long wall 322 are formed. In addition, by cutting the protection film 30 while moving the bit 1 downward to be inclined from the bottom surface of the protection film 30, an inclined second short wall 324 is formed. In this case, the protection film 30 is cut to the position separated from the second end 32 of the protection film 30 by a predetermined interval. Accordingly, the upper part 324b of the second short wall 324 is positioned to be separated from the second end 32 of the protection film 30 by the second separation distance d2. As described above, by using the bit 1, the groove 300 having the inner wall 320 including the inclined first short wall 323 and the second short wall 324 may be easily formed in the protection film 30.

Figure 6:
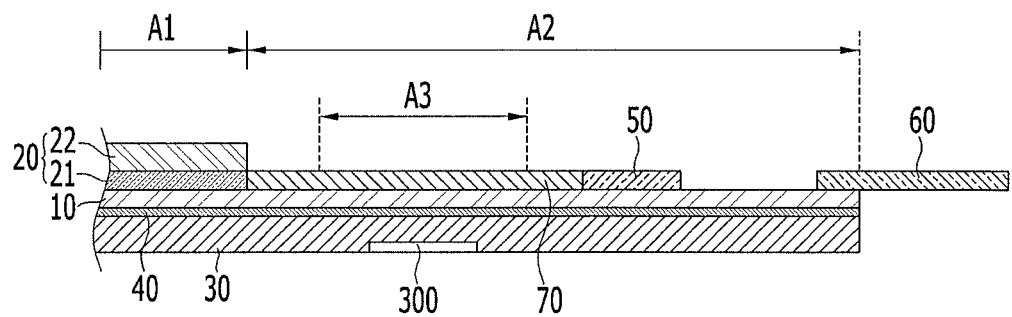
FIG. 6 illustrates a view showing a step following that of FIG. 5.

Next, as shown in FIG. 6, the driving circuit chip 50 and the printed circuit board (PCB) 60 may be adhered to the peripheral area A2 of the substrate 10. In the present exemplary embodiment, the driving circuit chip 50 and the printed circuit board (PCB) 60 are adhered on the substrate 10 after forming the groove 300 on the protection film 30, however it is not limited thereto, and the driving circuit chip 50 and the printed circuit board (PCB) 60 may be adhered on the substrate 10 before forming the groove 300, and this process sequence may be variously changed. For example, as illustrated in FIG. 6, the driving circuit chip 50 and the groove 300 may be on opposite surfaces of the substrate 10.

Figure 7:
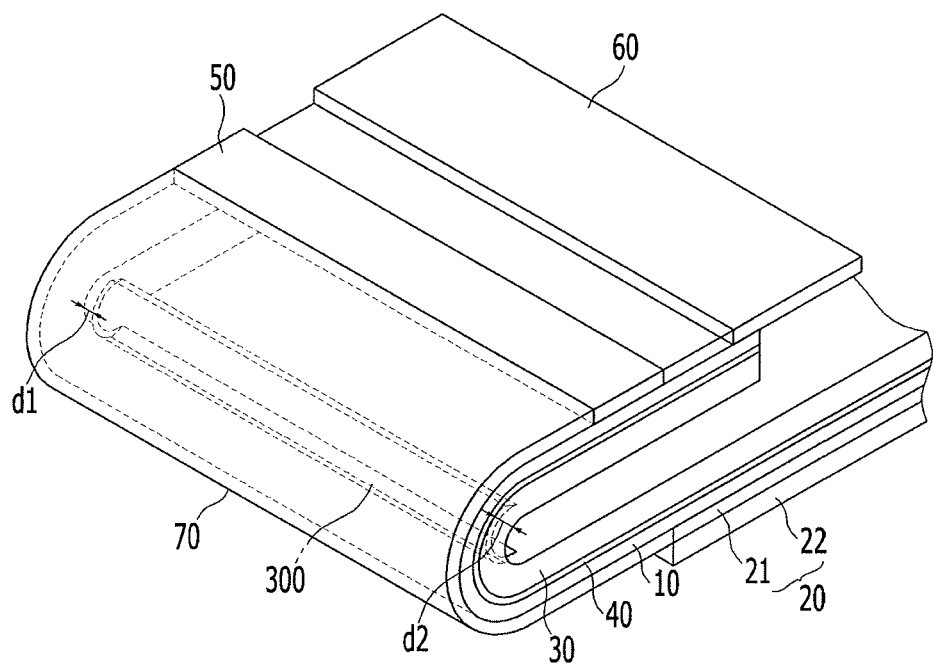
FIG. 7 illustrates a view showing a step following that of FIG. 6.

Next, as shown in FIG. 1 and FIG. 7, the bending region A3 of the substrate 10 is bent. For example, as illustrated in FIGS. 1 and 7, the substrate 10 may be bent at the groove 300, e.g., at the bending line CL traversing the groove 300 along the x-axis (FIG. 3), such that portions of the substrate 10 at opposite sides of the groove 300 along the x-axis may bend toward each other, e.g., to have the groove 300 between facing bent portions of the substrate 10. In this case, the groove 300 minimizes the stress acting on the substrate 10 and the protection film 30 when bending, such that damage to the substrate 10 in the bending region A3 is prevented. Also, since the groove 300 is positioned to be separated from both ends 31 and 32 of the protection film 30 by the first separation distance d1 and the second separation distance d2, the protection film 30 including the groove 300 is prevented from being damaged, such that handling of the substrate 10 and the protection film 30 may be easy.

Meanwhile, in the exemplary embodiment, only the first short wall 323 and the second short wall 324 are inclined. However, the first long wall and the second long wall may also be inclined as another exemplary embodiment.

Next, a display device according to another exemplary embodiment will be described with reference to FIG. 8 to FIG. 10.

Figure 8:
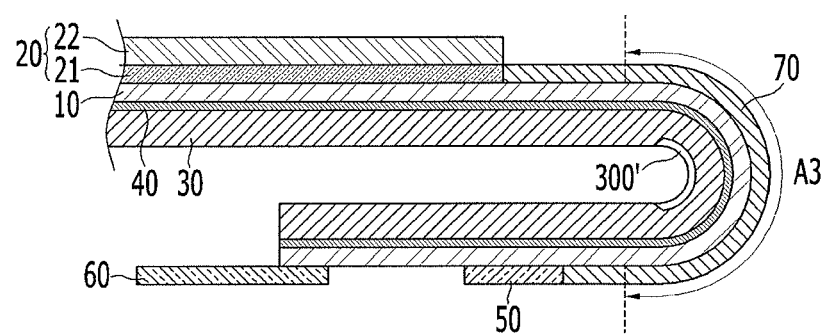
FIG. 8 illustrates a schematic lateral view of a display device according to another exemplary embodiment.
Figure 9:
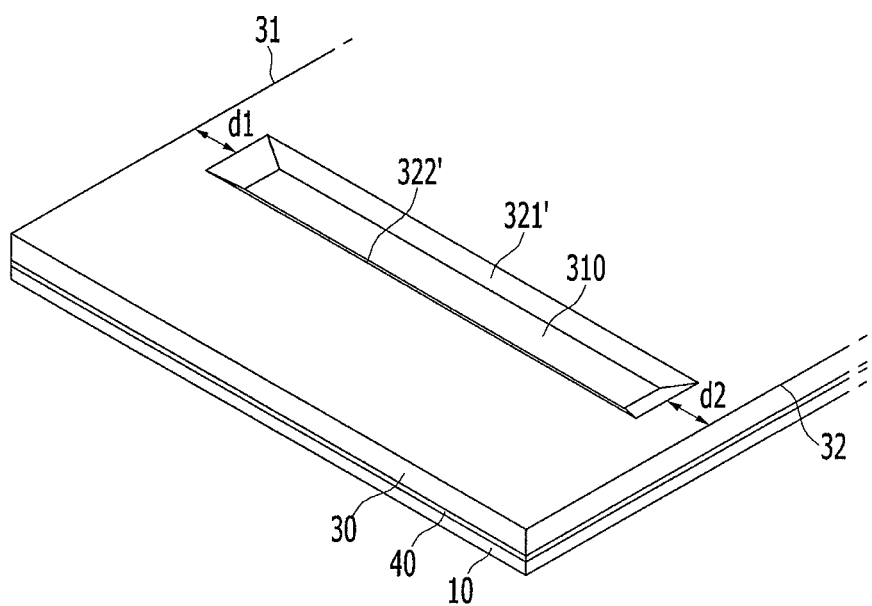
FIG. 9 illustrates a view of a flipped state of a substrate and a protection film before bending the substrate and the protection film of FIG. 8.
Figure 10:
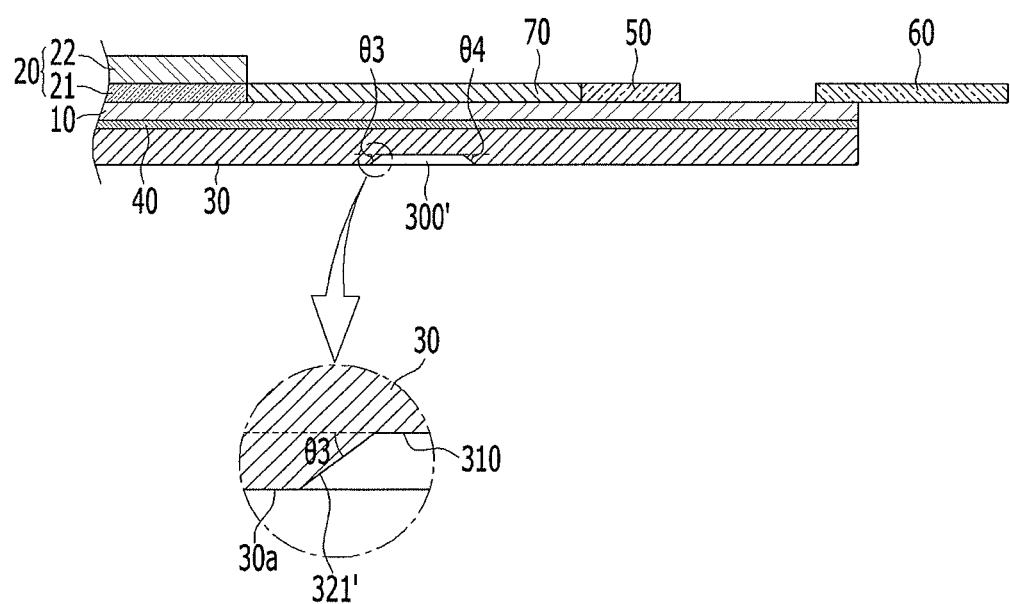
FIG. 10 illustrates a view before bending a display device of FIG. 8.

FIG. 8 is a schematic lateral view of a display device according to another exemplary embodiment, FIG. 9 is a view of a flipped state of the substrate 10 and the protection film 30 before bending the substrate 10 and the protection film 30 of FIG. 8, and FIG. 10 is a view before bending the display device of FIG. 8.

The exemplary embodiment shown in FIG. 8 to FIG. 10 is substantially the same as the exemplary embodiment shown in FIG. 1 to FIG. 3, except for the structure of the first long wall and the second long wall of the groove. Therefore, overlapping descriptions are omitted.

As shown in FIG. 8 to FIG. 10, a groove 300' of the protection film 30 of the display device according to the present exemplary embodiment is positioned to be separated from both ends 31 and 32 of the protection film 30.

A first long wall 321' and a second long wall 322' are inclined with respect to the bottom surface 310. A third inclination angle θ3 formed by the bottom surface 310 of the groove 300 and the first long wall 321' may be in a range of about 30 degrees to about 60 degrees. A fourth inclination angle θ4 formed by the bottom surface 310 of the groove 300 and the second long wall 322 may be in a range of about 30 degrees to about 60 degrees.

When the third inclination angle θ3 or the fourth inclination angle θ4 is smaller than about 30 degrees, the bending stress is increased when bending the substrate 10 and the protection film 30. When the third inclination angle θ3 or the fourth inclination angle θ4 is larger than about 60 degrees, the protection film 30 is easily damaged by the force applied to the protection film 30 by the bit 1 (referring to FIG. 4).

As above-described, by forming the first long wall and the second long wall to be inclined, as well as the first short wall and the second short wall, damage to the protection film 30 by the bit 1 in the manufacturing process may be minimized.

Meanwhile, in the exemplary embodiment, the groove having both the first short wall and the second short wall is formed. However, a groove only having the first short wall may be formed as another exemplary embodiment.

Next, a display device according to another exemplary embodiment will be described with reference to FIG. 11.

Figure 11:
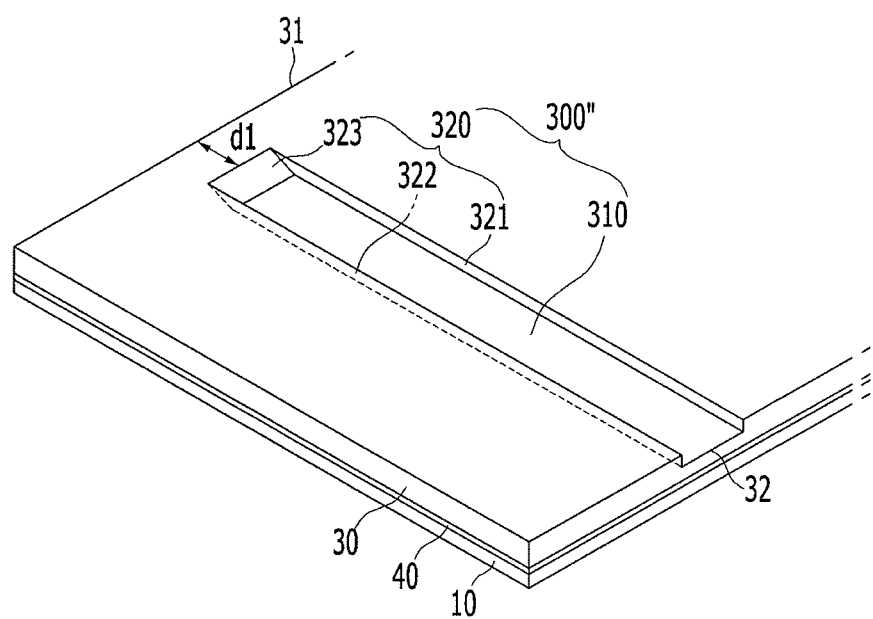
FIG. 11 illustrates a view of a flipped state of a substrate and a protection film as a view before bending the substrate and the protection film of a display device according to another exemplary embodiment.

FIG. 11 is a view of a flipped state of the substrate 10 and the protection film 30 before bending the substrate 10 and the protection film 30 of a display device according to another exemplary embodiment. The exemplary embodiment shown in FIG. 11 is substantially the same as the exemplary embodiment shown in FIG. 1 to FIG. 3, except for the structure of the groove, and therefore, repeated descriptions are omitted.

As shown in FIG. 11, a groove 300" of the display device according to the present exemplary embodiment is positioned to be separated from the first end 31 of the protection film 30 by the first separation distance d1. Also, the bottom surface 310 of the groove 300" is connected to the second end 32 of the protection film 30. That is, the inner wall 320 of the groove 300" according to the present exemplary embodiment shown in FIG. 11 only has the first short wall 323, the first long wall 321, and the second long wall 322 without the second short wall 324.

As above-described, in the display device according to the present exemplary embodiment, by forming the groove 300" to only have the first short wall 323, the first long wall 321, and the second long wall 322 in the protection film 30, the handling of the substrate 10 and the protection film 30 may be easy, and simultaneously the bending stress may be minimized when bending the substrate 10 and the protection film 30.

By way of summation and review, a display device having a chip on panel (COP) structure, in which the driving circuit chip is directly mounted on the substrate, a length of wires connecting the driving circuit chip and a display member increases, such that a width of the bezel part increases. In a high resolution structure, because a number of wires increases, the width of the bezel also increases.

In contrast, according to embodiments, a display device includes a bezel part with a reduced size. That is, according to an exemplary embodiment, a peripheral area of the substrate may be bent, so the width of the bezel part may be minimized and the display area may be maximized. Further, a protection film on the substrate may include a groove at the bending region of the substrate to minimize stress on the substrate and protection film during bending, such that damage to the substrate when bending may be prevented or substantially minimized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
    a substrate including a display area and a peripheral area outside the display area, the peripheral area including a bendable bending region;
    a display member on the display area of the substrate to display an image; and
    a protection film under the substrate, the protection film including a groove at a position corresponding to the bending region of the peripheral area, wherein
    the groove includes a bottom surface and inner walls extending from the bottom surface to a surface of the protection film, the inner walls of the groove including a first inner wall and a second inner wall facing each other in a first direction perpendicular to a second direction, the second direction being from the display area to the peripheral area, the first direction and the second direction are disposed on a same plane that is parallel to the substrate, the first and second inner walls of the protection film are spaced apart from opposite outer walls of the protection film in the first direction, respectively, and the first and second inner walls are inclined from the bottom surface.

2. The display device as claimed in claim 1, wherein:
the first inner wall is inclined to the first direction, and
the second inner wall is inclined to a direction opposite to the first direction.

3. The display device as claimed in claim 2, wherein an area of an opening of the groove positioned on a same plane as the surface of the protection film is larger than an area of the bottom surface of the groove.

4. The display device as claimed in claim 3, wherein the groove has a rectangular shape from a top view and a trapezoidal shape from a cross-sectional side view.

5. The display device as claimed in claim 2, wherein:
the inner walls include a first long wall and a second long wall facing each other, and
a first short wall and a second short wall connecting the first long wall and the second long wall to each other, the first short wall and the second short wall being inclined.

6. The display device as claimed in claim 5, wherein:
a first separation distance from a first end of the protection film to the first short wall of the groove is about 1% to about 10% of an entire width of the protection film, and
a second separation distance from a second end of the protection film to the second short wall of the groove is about 1% to about 10% of the entire width of the protection film.

7. The display device as claimed in claim 5, wherein:
a first inclination angle defined by the bottom surface of the groove and the first short wall is in a range of about 30 degrees to about 60 degrees, and
a second inclination angle defined by the bottom surface of the groove and the second short wall is in a range of about 30 degrees to about 60 degrees.

8. The display device as claimed in claim 2, wherein:
the bottom surface of the groove has a plurality of protrusions, and
a height of the protrusions is about 200 nm or more.

9. The display device as claimed in claim 5, wherein the first long wall and the second long wall are inclined.

10. The display device as claimed in claim 9, wherein:
a third inclination angle defined by the bottom surface of the groove and the first long wall is in a range of about 30 degrees to about 60 degrees, and a fourth inclination angle defined by the bottom surface of the groove and the second long wall is in a range of about 30 degrees to about 60 degrees.

11. The display device as claimed in claim 2, wherein:
the groove is separated from a first end of the protection film, and
the bottom surface of the groove is connected to a second end of the protection film.

12. The display device as claimed in claim 11, wherein:
the inner wall includes a first long wall and a second long wall facing each other, and
a first short wall connecting the first long wall and the second long wall to each other, the first short wall being inclined.

13. The display device as claimed in claim 12, wherein the first separation distance from the first end of the protection film to the first short wall of the groove is in a range of about 1% to about 10% of the entire width of the protection film.

14. The display device as claimed in claim 12, wherein:
a first inclination angle defined by the bottom surface of the groove, and
the first short wall is in a range of about 30 degrees to about 60 degrees.

15. The display device as claimed in claim 11, wherein:
the bottom surface of the groove has a plurality of protrusions, and
a height of the protrusions is about 200 nm or more.

16. The display device as claimed in claim 1, wherein the substrate is bendable at the groove, the groove being on a surface of the protection film facing away from the substrate.

17. A display device, comprising:
a substrate including a display area and a peripheral area outside the display area, the peripheral area including a bendable bending region;
a display member on the display area of the substrate to display an image; and
a protection film under the substrate, the protection film including a groove at a position corresponding to the bending region of the peripheral area, wherein
the groove includes a bottom surface and inner walls extending from the bottom surface to a surface of the protection film, the inner walls of the groove including a first inner wall and a second inner wall facing each other in a first direction perpendicular to a second direction, the second direction being from the display area to the peripheral area,
the first direction and the second direction are disposed on a same plane that is parallel to the substrate, and
the first and second inner walls of the protection film are spaced apart from opposite outer walls of the protection film in the first direction, respectively, the first and second inner walls being inclined from the bottom surface.

* * * * *